(12) United States Patent
Kister

(10) Patent No.: US 8,829,937 B2
(45) Date of Patent: Sep. 9, 2014

(54) FINE PITCH GUIDED VERTICAL PROBE ARRAY HAVING ENCLOSED PROBE FLEXURES

(75) Inventor: January Kister, Portola Valley, CA (US)

(73) Assignee: FormFactor, Inc., Livermore, CA (US)

( * ) Notice: Subject to any disclaimer, the term of this patent is extended or adjusted under 35 U.S.C. 154(b) by 198 days.

(21) Appl. No.: 12/931,260

(22) Filed: Jan. 27, 2011

(65) Prior Publication Data

US 2012/0194212 A1 Aug. 2, 2012

(51) Int. Cl.
*G01R 31/00* (2006.01)
*G01R 31/20* (2006.01)
*G01R 31/26* (2014.01)
*G01R 1/06* (2006.01)
*G01R 1/073* (2006.01)
*G01R 1/067* (2006.01)

(52) U.S. Cl.
CPC ........ *G01R 1/07357* (2013.01); *G01R 1/06716* (2013.01)
USPC ............ 324/756.03; 324/754.12; 324/762.01; 324/149

(58) Field of Classification Search
CPC .................................................. G01R 1/06722
USPC ....................... 324/756.03, 754.12
See application file for complete search history.

(56) References Cited

U.S. PATENT DOCUMENTS

| | | | |
|---|---|---|---|
| 5,952,843 A | 9/1999 | Vinh | |
| 6,414,502 B1 | 7/2002 | Sayre et al. | |
| 6,768,331 B2 | 7/2004 | Longson et al. | |
| 7,649,367 B2 | 1/2010 | Kister | |
| 2002/0000821 A1* | 1/2002 | Haga et al. | 324/761 |
| 2005/0189958 A1 | 9/2005 | Chen et al. | |
| 2006/0170440 A1* | 8/2006 | Sudin | 324/757 |
| 2006/0186905 A1 | 8/2006 | Kohashi et al. | |
| 2006/0261828 A1* | 11/2006 | Cram et al. | 324/754 |
| 2008/0100320 A1* | 5/2008 | Miller et al. | 324/754 |
| 2008/0150560 A1* | 6/2008 | Richmond et al. | 324/754 |
| 2008/0157799 A1* | 7/2008 | Gritters et al. | 324/762 |
| 2008/0265873 A1* | 10/2008 | Kister | 324/149 |
| 2010/0207654 A1* | 8/2010 | Hsu | 324/761 |

* cited by examiner

*Primary Examiner* — Jermele M Hollington
*Assistant Examiner* — Christopher McAndrew
(74) *Attorney, Agent, or Firm* — Lumen Patent Firm

(57) ABSTRACT

Probes suitable for use with densely packed fine-pitch 2-D contact arrays are provided by use of an electrically insulating guide plate in connection with vertical probes, where the vertical probes have probe flexures that are either vertically folded sections, or coils having a horizontal axis. Preferably, the probes are configured such that the probe flexures are inside the guide plate holes, and the parts of the probes extending past the guide plate are relatively rigid. This configuration alleviates problems associate with probe shorting, because the probe flexures are enclosed by the guide plate holes, and are therefore unable to come into contact with flexures from other probes during probing.

10 Claims, 6 Drawing Sheets

FINE PITCH GUIDED VERTICAL PROBE ARRAY HAVING ENCLOSED PROBE FLEXURES

FIELD OF THE INVENTION

This invention relates to probe arrays for electronic part testing.

BACKGROUND

Arrays of probes are often employed for electronic part testing, especially in connection with integrated circuit (IC) chips. Progress in IC chip technology tends to entail an increased number of contacts per IC chip and/or a decrease in the spacing between chip contacts. This spacing is known as the pitch of the contacts. A relatively recent development in IC technology is the use of chip contacts that are arranged in a fine-pitch densely packed 2-D array. FIG. 1 shows an example of such a contact array 104 on a chip 102. Previously, chip contacts have usually been arranged as linear arrays of contacts (i.e., 1-D arrays that are not densely packed in two dimensions).

This change from 1-D to 2-D arrays of chip contacts has significant implications for probe design, and approaches that are suitable for a 1-D contact array are generally unsuitable for use with 2-D arrays. An example of the difficulties that can arise in such cases is shown on FIG. 2. In this example, a vertical probe 204 has a flexure section 206 and passes through a guide plate 202 to control the position of the probe tip (at bottom of figure). Extending the probe concept of FIG. 2 to a 1-D array of contacts has been done. For a 1-D probe array, it is possible to arrange the probes such that the flexure section 206 of each probe has room to move during operation without shorting to another probe. Such 1-D probe arrays can have fine pitch (i.e., 100 µm or less) between adjacent probes without shorting.

However, it is typically not possible to arrange probes as shown on FIG. 2 in a fine pitch, densely-packed 2-D probe array without encountering insuperable probe shorting issues. This problem is further exacerbated by deformation of probes during normal operation of the probe array (i.e., the contact force between probes and chip is usually sufficient to elastically deform the probes). Thus, even if a non-shorting arrangement of probes is possible when the probes are not deformed, it is likely that probe deformation during use will lead to shorts.

Accordingly, it would be an advance in the art to provide probe arrays suitable for probing densely packed, fine-pitch 2-D contact arrays.

SUMMARY

Probes suitable for use with densely packed fine-pitch 2-D contact arrays are provided by use of an electrically insulating guide plate in connection with vertical probes, where the vertical probes have probe flexures that are either vertically folded sections, or coils having a horizontal axis. These kinds of probe flexures can be fabricated at the required probe dimensions (e.g., consistent with a pitch of 100 µm or less). Preferably, the probes are configured such that the probe flexures are inside the guide plate holes, and the parts of the probes extending past the guide plate are relatively rigid. This configuration alleviates the above-identified problem of probe shorting, because the probe flexures are enclosed by the guide plate holes, and are therefore unable to come into contact with flexures from other probes during probing.

DETAILED DESCRIPTION

Figure 3A:
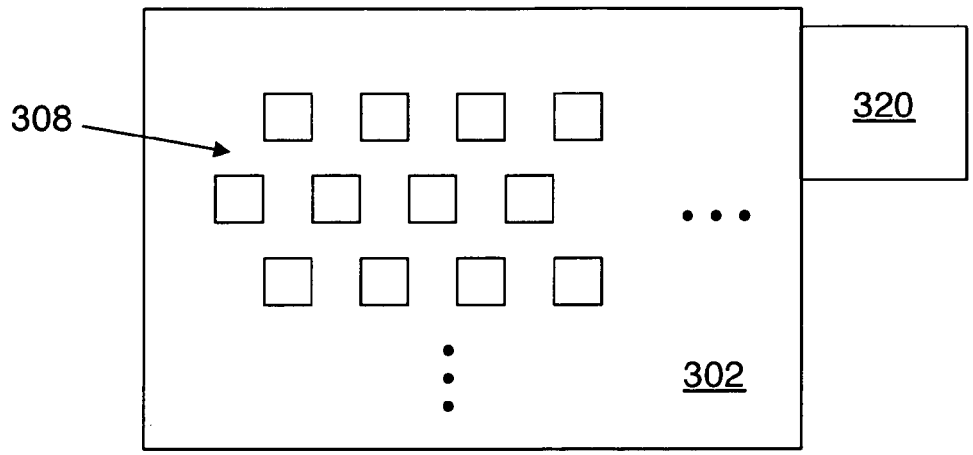
FIGS. 3a-c show top views of probe guide plates suitable for use with embodiments of the invention.
Figure 3B:
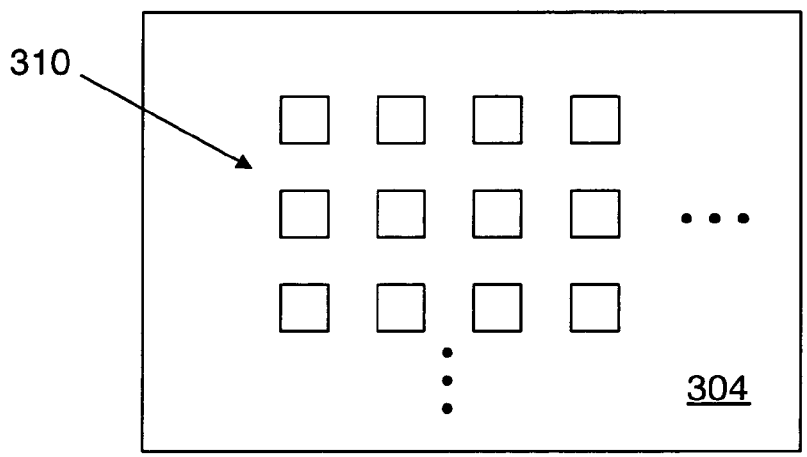
Figure 3C:
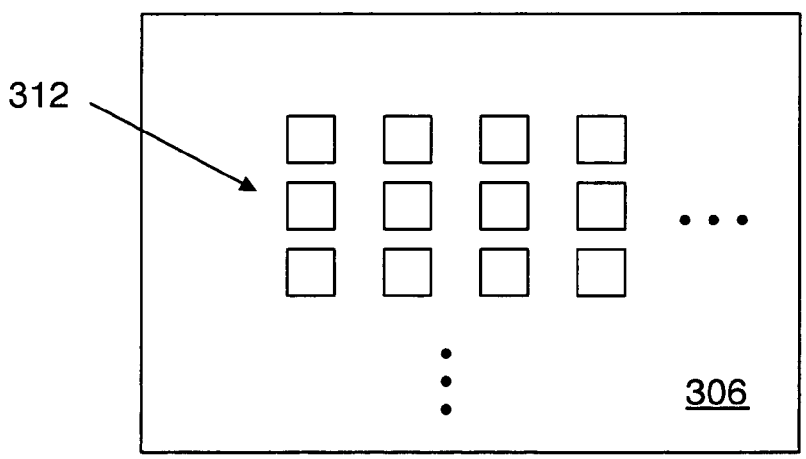

FIGS. 3a-c show top views of guide plates suitable for use with embodiments of the invention. In these examples, a guide plate 302 may have a hexagonal (or triangular) close packed 2-D array of through holes 308, a guide plate 304 may have a square close packed 2-D array of through holes 310, and a guide plate 306 may have a rectangular close packed 2-D array of through holes 312. Optionally, a heat sink 320 may be coupled to the guide plate, e.g., as shown on FIG. 3a, to provide heat removal capability in the guide plate. Such heat removal can be important in cases where probe current carrying capacity (CCC) is thermally limited, which is often the case in practice. Such a heat sink may be mechanically coupled to the guide plate, or can be any other way of removing heat from the guide plate (e.g., forced air/gas flow).

Figure 1:
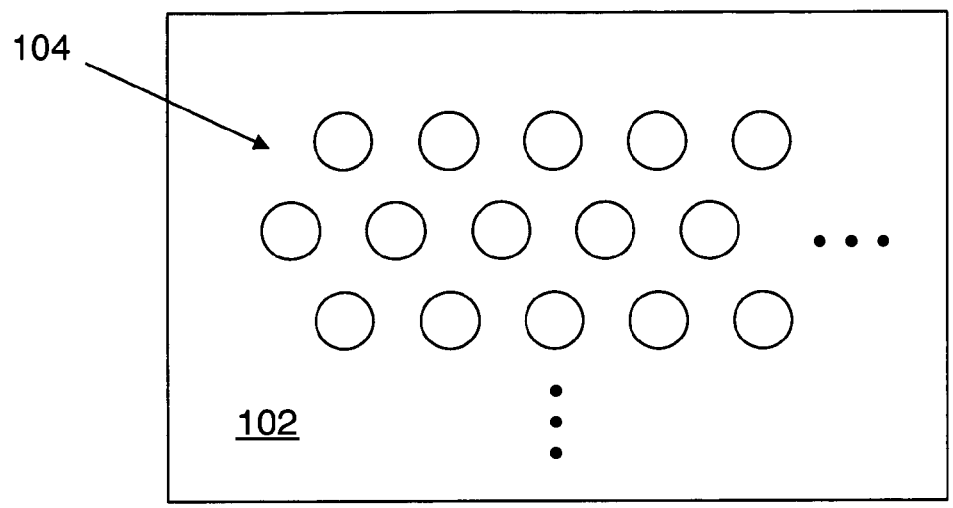
FIG. 1 shows a dense packed array of probe contact points on an electronic part.
Figure 2:
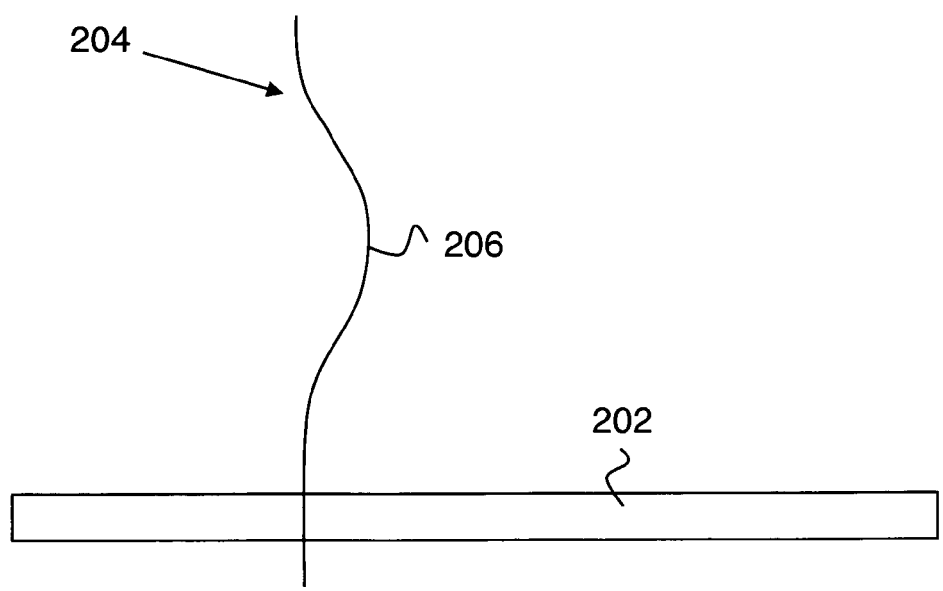
FIG. 2 shows a prior art probe concept.

The examples of FIGS. 3a-c are representative, and the invention can be practiced with any arrangement of through holes in the guide plate. However, the hole pattern of the guide plate does need to match the contact pattern for the IC chip to be tested. For example, a guide plate as in FIG. 3b or 3c would be unsuitable for use in connection with a chip having the contact pattern of FIG. 1. Instead, the guide plate of FIG. 3a would be used. As indicated above, an important aspect of these contact patterns is their fine pitch. For one probe array design, the IC chip had a hexagonal close packed pattern of contacts on a 45 µm pitch, and the probes and guide plate were scaled accordingly. Thus, the guide plate controls the probe alignment.

Figure 4A:
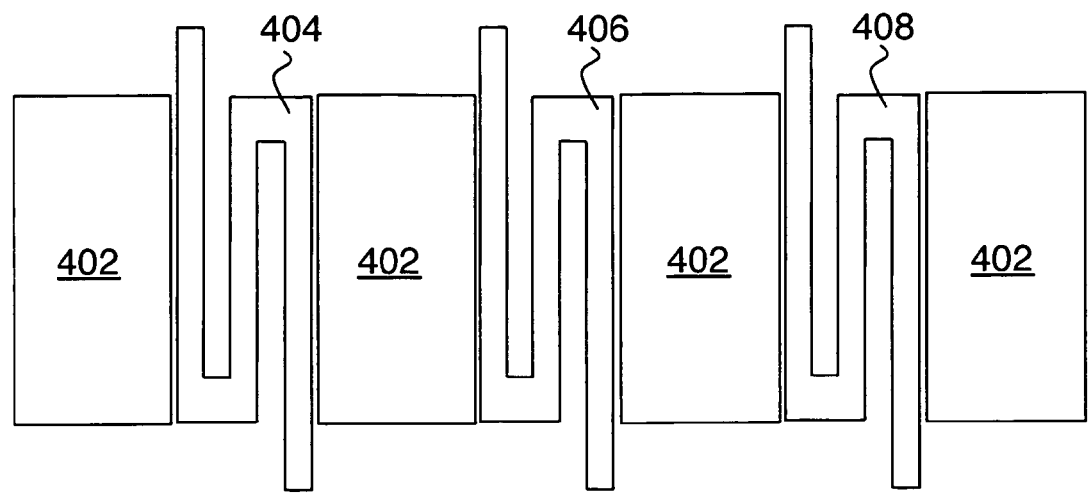
FIGS. 4a-b show side views of embodiments of the invention having vertically folded probes.
Figure 4B:
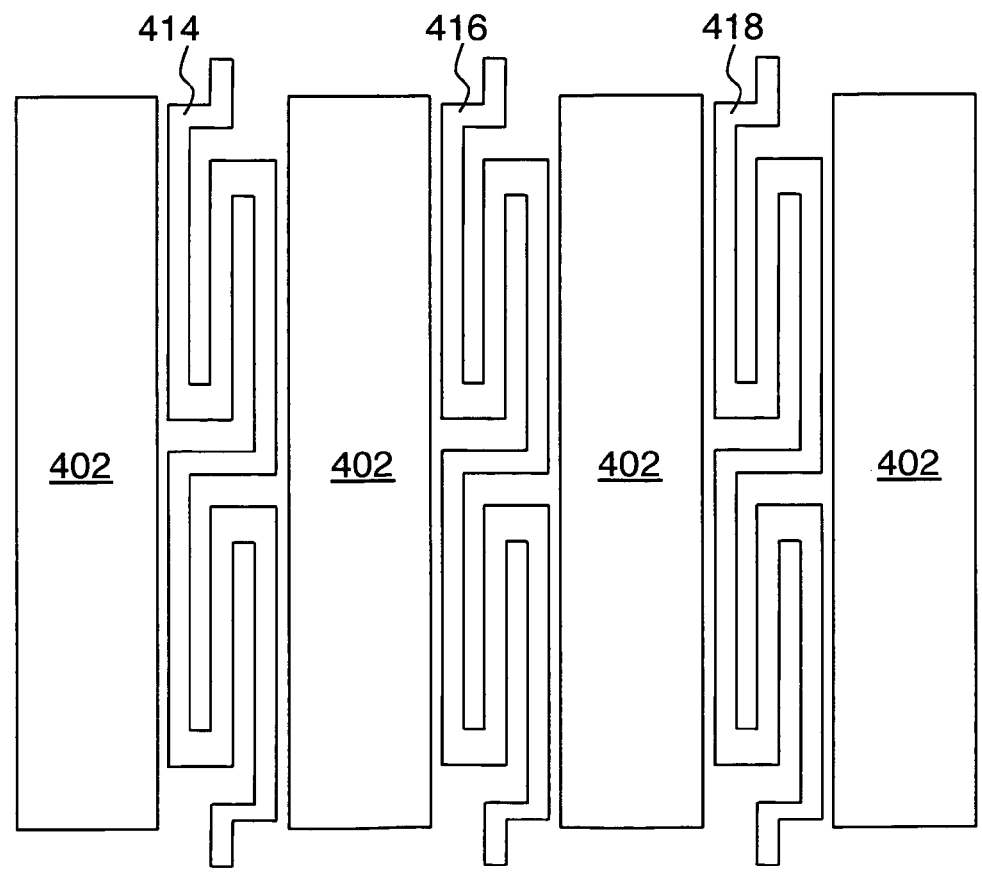

FIGS. 4a-b show side views of an embodiment of the invention. In this example, probes 404, 406, and 408 are shown disposed in through holes of guide plate 402. The probes of this example have probe flexures that are vertically folded sections of the probes. Preferably, as shown on FIGS. 4a-b, the probe flexures are inside the through holes of the guide plate, which prevents probe shorting due to motion of the probe flexures. Guide plate 402 is an electrical insulator to avoid shorting probes. Suitable materials for the guide plate include but are not limited to: silicon nitride, aluminosilicate, and polyimide. Suitable materials for the probes include but are not limited to: NiCo, Cu alloys, composite metals (e.g., NiCo body with a Rh tip), and Tungsten.

Depending on the details of probe mechanical design, it may be useful to include more than one vertically folded section in the probe flexure. The example of FIG. 4a shows a single folded section, while the example of FIG. 4b shows two vertically folded sections in the probe flexure. Any number of vertically folded sections can be employed. Adding vertically folded sections to a probe design tends to scale the pitch and probe over-travel together, provided other details of probe design, such as material and lateral dimensions are held constant. Here, the probe over-travel is the vertical difference between probe base position when first contact is made with a chip, and probe base position in the chip testing configuration. In other words, the over-travel is the vertical distance compression experienced by the probe during normal probing of a device under test.

With vertically folded probes as shown in FIGS. 4a-b, the current path along the length of the probe is increased due to the vertically folded sections. This may be undesirable in situations where resistive heating of the probes significantly affects probe current carrying capacity.

Figure 5A:
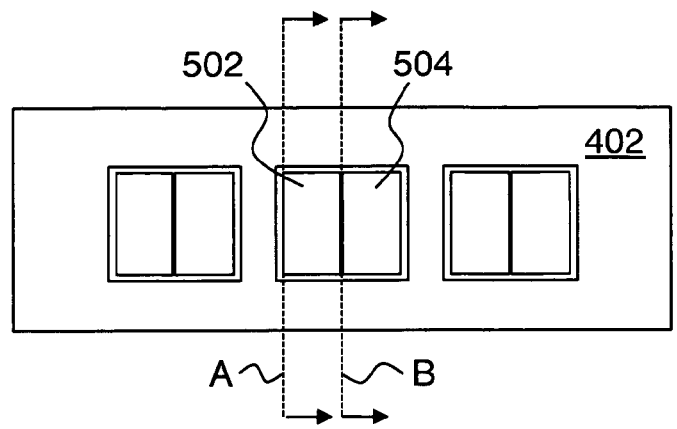
FIGS. 5a-c show an embodiment of the invention having probes disposed pair wise in guide plate through holes.
Figures 5B, 5C:
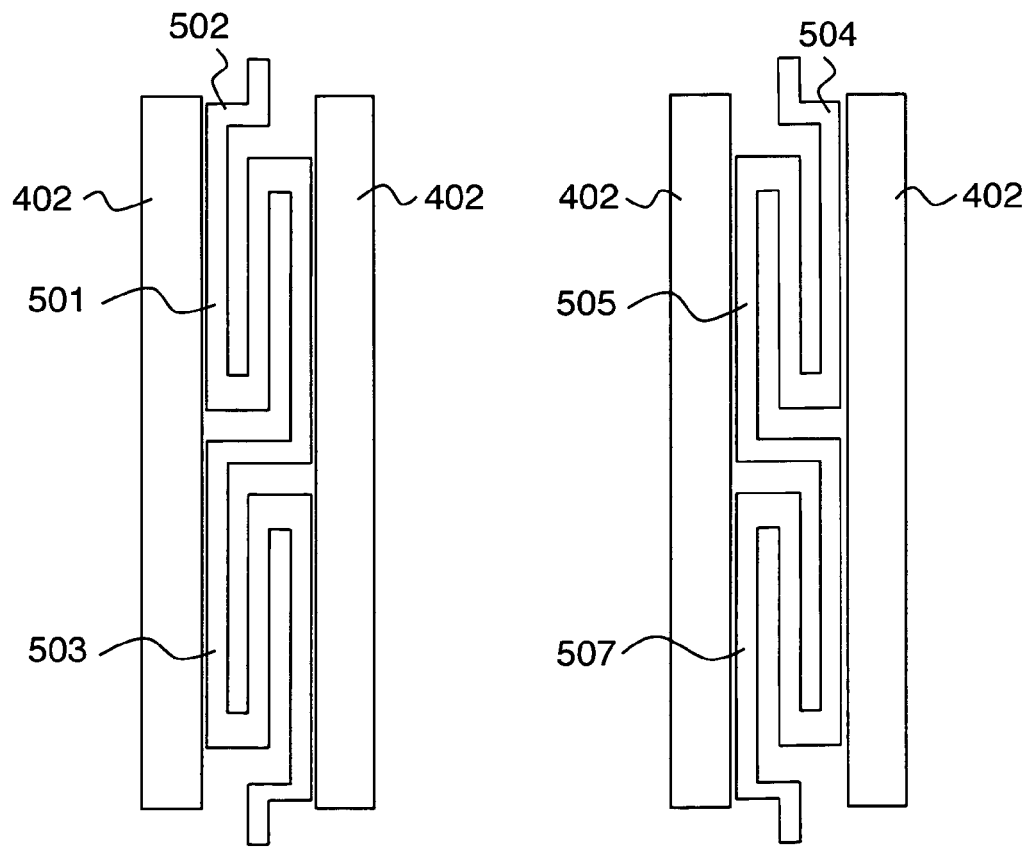

FIGS. 5a-b shows an embodiment of the invention that addresses this potential issue. In this example, vertically folded probes are disposed in through holes of guide plate 402. In contrast to the examples of FIGS. 4a-b, where each through hole had a single probe in it, here each through hole has two probes in it. In other words, the probes are disposed pair wise in the guide plate through holes, as opposed to individually. Preferably, all probes have the same shape (to expedite probe array fabrication), and the probes that share each through hole are rotated with respect to each other by 180 degrees about a probe vertical axis. Probes sharing the same through hole will make electrical contact with each other, so they should probe either the same contact on the device under test (DUT), or separate contact pads that are electrically connected on the DUT (e.g., as can occur for a power supply or ground contact).

FIGS. 5b and 5c show this relative rotation. FIG. 5b shows a side view of probe 502 along line A of FIG. 5a, and FIG. 5c shows a side view of probe 504 along line B of FIG. 5a. As shown on FIGS. 5b and 5c, the two probes sharing a through hole (i.e., probes 502 and 504) have the same shape, but one of the two probes is rotated 180 degrees about its vertical axis relative to the other probe. This provides a more direct current path from the probe base to the probe tip, because current can flow from probe 502 to probe 504 (and vice versa) as opposed to being limited to following the folded vertical sections of the probes. This probe configuration may also advantageously reduce the chance of probes jamming in the guide plate through holes as a result of normal probe deflection. More specifically, probe jamming can be reduced when the edges of the crosslink in the meandering probe shapes are not overlapping (i.e., the cross link of one probe falls on the straight section of the other probe). In the example of FIGS. 5a-c, straight sections 501 and 503 of probe 502 line up with cross links 505 and 507 of probe 504.

Vertically folded probes as in the preceding examples have several significant design characteristics. This approach is scalable in pitch over a range that at least includes 30 µm pitch to 110 µm pitch. Probes in separate guide plate holes are permanently electrically isolated from each other, which removes the potential for probe shorting at ultra low probe pitches. For one design, probe length was 75 µm and probe over-travel was 1 µm. As indicated above, probe length and over-travel can be scaled together by incorporating multiple vertically folded sections into the probes.

Figure 6A:
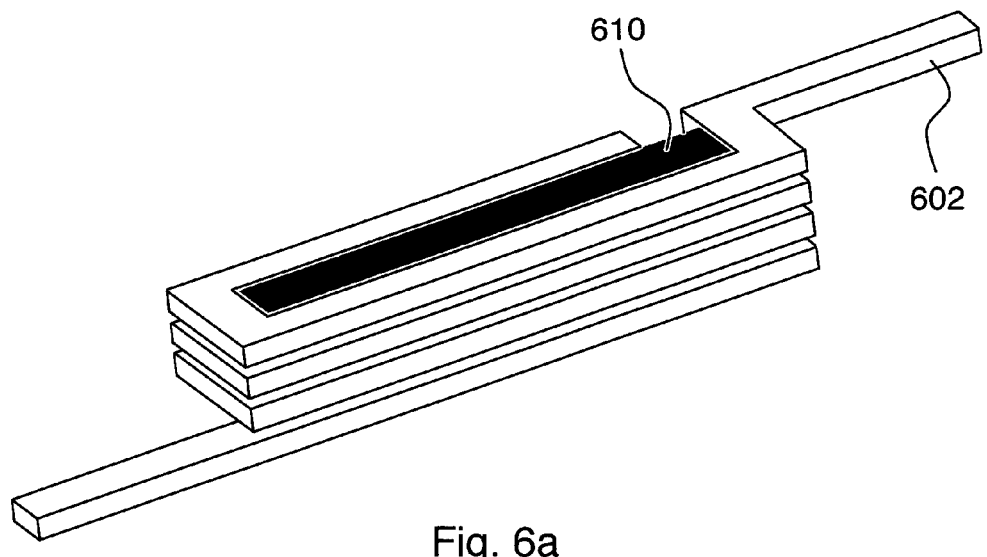
FIGS. 6a-b show an embodiment of the invention having horizontally coiled probes.
Figure 6B:
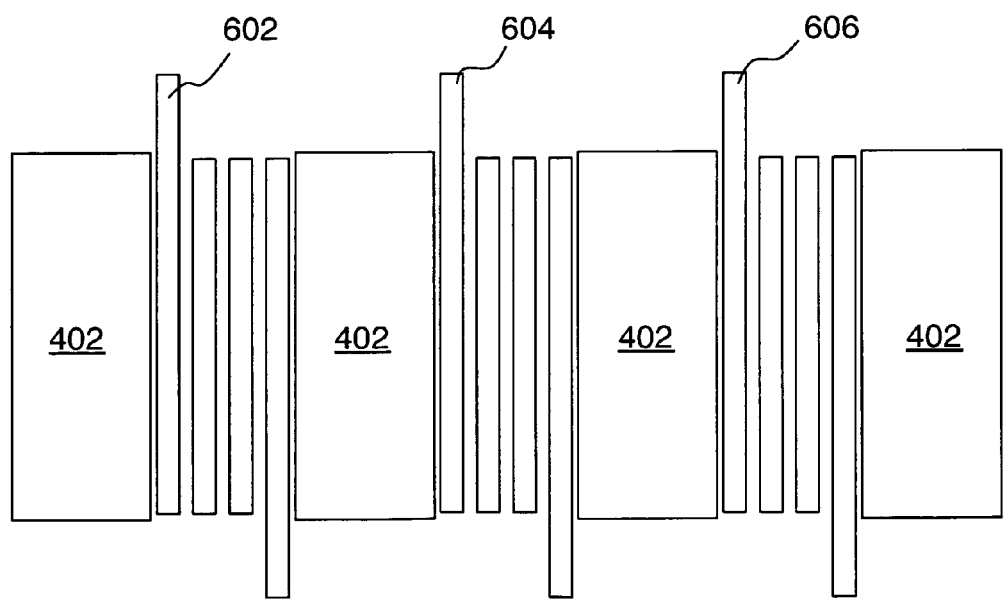

FIGS. 6a-b show an alternative probe configuration where the probe flexure is a coil having a horizontal axis. Here probes 602, 604, and 606 are disposed in through holes of a guide plate 402. As indicated above, it is preferred that the probe flexures be within the guide plate through holes, and that parts of the probe extending beyond the guide plate be relative rigid compared to the probe flexures. Optionally, the probe coils can be filled with a material 610 to improve electrical and/or thermal conduction relating to the probe. For example, electrically conductive silicone rubber can be employed as material 610. It is advantageous to electrically connect the coil loops for a single probe to each other to reduce probe resistance, and a flexible material such as silicone rubber will not interfere significantly with the probe mechanical design. It is further advantageous for material 610 to improve heat transfer from the probe to the guide plate, thereby providing improved heat removal from the probes, which can increase the probe current carrying capacity.

Probes with horizontal coils as in the example of FIGS. 6a-b have several significant design characteristics. This approach is simple and provides low profile probes. Probes in separate guide plate holes are permanently electrically isolated from each other, which removes the potential for probe shorting at ultra low probe pitches. For one design, probe over-travel was >50 µm. Greater over-travel is possible using longer horizontal coil probes.

Figures 7A, 7B:
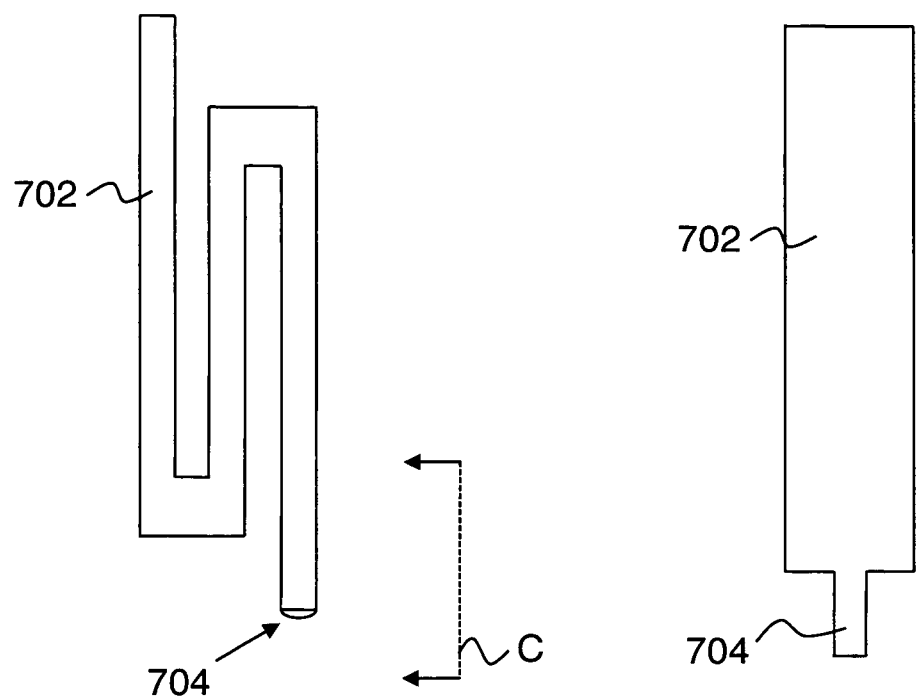
FIGS. 7a-b show a probe having a reduce width skate on its tip.

In some cases, it is preferred for the probe tips to include a reduced-width skate, e.g., as shown on FIGS. 7a-b. In this example, a probe 702 includes a skate 704 at its tip. FIG. 7b shows a close up side view along line A of FIG. 7a. Here the reduced width of skate 704 is apparent. Such probe skates can reduce contact resistance and provide more reliable contact between the probes and the DUT contacts. Skates can be employed in connection with vertically folded probes (as in the example of FIGS. 7a-b), or in connection with probes having a horizontal coil.

Solder re-flow can be employed to reduce probe contact resistance. In this situation, the probe distal ends are solder reflowed. Here probe distal ends refers to ends of the probe that are away from (i.e., distal to) the contact point between probe and DUT. Such reflow can reduce resistance between the probes and the probe carrier the probes are connected to. This solder reflow approach can be employed in connection with vertically folded probes or with probes having horizontal coils.

Probes as described above can be made with conventional probe fabrication approaches, including but not limited to: electroforming, micro-electrical-mechanical systems (MEMS) fabrication technology, multilayer plating, and etching of metal foil (e.g. with deep reactive ion etching (DRIE)).

Vertically folded probes tend to be especially suitable for applications having very tight pitch requirements (e.g. <60 µm), while probes having horizontal coils tend to be more suitable for applications that can have a relatively large pitch (e.g. pitch between 80 µm and 150 µm), but which also require significant probe over-travel (e.g. over-travel >50 µm).

The invention claimed is:

1. A probe array comprising:
   two or more vertical probes each including a probe flexure;
   a guide plate having two or more through holes, wherein the vertical probes are disposed in the through holes;
   wherein the probe flexures include coils having a horizontal coil axis, wherein the horizontal coil axis is perpendicular to an axis through the through holes, and wherein the horizontal coil axis is enclosed by coil loops formed by a single member that winds around the horizontal coil axis.

2. The probe array of claim 1, wherein the probe flexures are inside the through holes, and wherein parts of the probes that extend beyond the through holes are substantially more rigid than the probe flexures.

3. The probe array of claim 1, wherein adjacent probes are spaced by 100 µm or less.

4. The probe array of claim 3, wherein the probes are arranged in a 2-D densely packed array.

5. The probe array of claim 4, wherein the 2-D densely packed array is selected from the group consisting of: hexagonal arrays, triangular arrays, square arrays and rectangular arrays.

6. The probe array of claim 1, further comprising a heat sink or heat removal apparatus coupled to the guide plate.

7. The probe array of claim 1, wherein each of the probes includes a reduced-width skate at its tip.

8. The probe array of claim 1, further comprising heat sink material disposed in the coils.

9. The probe array of claim 8, wherein the heat sink material comprises electrically and thermally conductive silicone rubber.

10. The probe array of claim 1, wherein the vertical probes are individually disposed in the through holes.

\* \* \* \* \*